United States Patent
Xue et al.

(10) Patent No.: US 9,640,569 B2
(45) Date of Patent: May 2, 2017

(54) DOPING METHOD FOR ARRAY SUBSTRATE AND MANUFACTURING EQUIPMENT OF THE SAME

(71) Applicant: Shenzhen China Star Optoelectronics Technology Co., Ltd., Shenzhen, Guangdong (CN)

(72) Inventors: Jingfeng Xue, Guangdong (CN); Xin Zhang, Guangdong (CN); Gui Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 204 days.

(21) Appl. No.: 14/426,224

(22) PCT Filed: Dec. 29, 2014

(86) PCT No.: PCT/CN2014/095383
§ 371 (c)(1),
(2) Date: Mar. 5, 2015

(87) PCT Pub. No.: WO2016/090689
PCT Pub. Date: Jun. 16, 2016

(65) Prior Publication Data
US 2016/0343745 A1  Nov. 24, 2016

(30) Foreign Application Priority Data
Dec. 12, 2014  (CN) .......................... 2014 1 0768331

(51) Int. Cl.
*H01L 27/12* (2006.01)
*H01L 29/786* (2006.01)
(Continued)

(52) U.S. Cl.
CPC ........ *H01L 27/1288* (2013.01); *H01L 21/223* (2013.01); *H01L 21/266* (2013.01);
(Continued)

(58) Field of Classification Search
None
See application file for complete search history.

(56) References Cited

U.S. PATENT DOCUMENTS

2012/0139045 A1* 6/2012 Kim ...................... H01L 27/124
257/347

* cited by examiner

*Primary Examiner* — Cheung Lee
(74) *Attorney, Agent, or Firm* — Andrew C. Cheng

(57) ABSTRACT

A doping method for an array substrate and a manufacturing equipment. The doping method comprises: using a halftone mask to form a photoresist pattern layer on a gate insulation layer of a substrate; wherein, a polysilicon pattern layer is disposed on the substrate; the gate insulation layer covers the polysilicon pattern layer; the photoresist pattern layer corresponding to a heavily doping region forms a hollow portion; the photoresist pattern layer corresponding to a lightly doping region forms a first photoresist portion; the photoresist pattern layer corresponding to an undoped region forms a second photoresist portion; the first photoresist portion is thinner than the second photoresist portion; and performing one doping process to the polysilicon pattern layer such that the heavily doping region and the lightly doping region of the polysilicon pattern layer are formed simultaneously in order to reduce the manufacturing process of an LTPS array substrate.

8 Claims, 7 Drawing Sheets

(51) Int. Cl.
*H01L 21/223* (2006.01)
*H01L 21/265* (2006.01)
*H01L 21/266* (2006.01)
*H01L 29/66* (2006.01)

(52) U.S. Cl.
CPC ........ *H01L 21/2652* (2013.01); *H01L 27/127* (2013.01); *H01L 29/66492* (2013.01); *H01L 29/66757* (2013.01); *H01L 29/786* (2013.01)

DOPING METHOD FOR ARRAY SUBSTRATE AND MANUFACTURING EQUIPMENT OF THE SAME

BACKGROUND OF THE INVENTION

1. Field of the Invention

The present invention relates to a display technology field, and more particularly to a doping method for an array substrate and a manufacturing equipment of the same.

2. Description of Related Art

TFT-LCD liquid crystal displays can be divided into a polysilicon (Poly-Si TFT) type and an amorphous silicon (a-Si TFT) type. Besides, because a low-temperature polysilicon (referred as LTPS) LCD display has advantages of high resolution, high color saturation, and low cost with comparing to the conventional a-Si TFT display, the LTPS-TFT LCD liquid crystal display becomes the mainstream of the next generation display.

The manufacturing process of the LTPS-TFT LCD is more complex and has many drawbacks. One of the drawbacks is that a turn-off current (I off) of a TFT (thin film transistor) is larger. In order to decrease the I off, a dual gate structure or a lightly doping drain (referred as LDD) structure is adopted. In the conventional art, to realize the LDD structure, two doping processes are required (N-type heavily doping and N-type lightly doping). The two doping processes use a photomask to perform the N-type heavily doping first, removing a photoresist, and then, performing the N-type lightly doping. The two doping processes of the conventional technology not only increase the manufacturing process but also increase the cost.

SUMMARY OF THE INVENTION

Accordingly, the present invention provides a doping method for an array substrate and a manufacturing method of the same in order to realize simultaneously forming a heavily doping region and a lightly doping region of a polysilicon pattern layer.

In order to solve above technology problems, the present invention provides a doping method for an array substrate, comprising: forming a polysilicon pattern layer on a substrate; forming a gate insulation layer on the substrate having the polysilicon pattern layer; forming a gate pattern layer on the gate insulation layer; using a halftone mask to form a photoresist pattern layer on the gate insulation layer; wherein, the gate insulation layer covers on the polysilicon pattern layer; the photoresist pattern layer corresponding to a heavily doping region of the polysilicon pattern layer forms a hollow portion; the photoresist pattern layer corresponding to a lightly doping region of the polysilicon pattern layer forms a first photoresist portion; the photoresist pattern layer corresponding to an undoped region of the polysilicon pattern layer forms a second photoresist portion; the first photoresist portion is thinner than the second photoresist portion; and wherein, the halftone mask includes a full transparent portion corresponding to the hollow portion, a semi-transparent portion corresponding to the first photoresist portion, and a non-transparent portion corresponding to the second photoresist portion; exposing the photoresist pattern layer using the halftone mask in order to form three exposure degrees of an exposed portion, a semi-exposed portion, and an unexposed portion; respectively etching the three exposure degrees in order to form the hollow portion corresponding to the exposed portion, the first photoresist portion corresponding to the semi-exposed portion, and the second photoresist portion corresponding to the unexposed portion; and performing one doping process to the polysilicon pattern layer such that the heavily doping region and the lightly doping region of the polysilicon pattern layer are formed simultaneously.

Wherein, in the step of performing one doping process to the polysilicon pattern layer comprises: utilizing a diffusion method or an ion implantation method to dope low temperature poly-silicon (LTPS) in order to form the polysilicon pattern layer such that the polysilicon pattern layer includes the heavily doping region and the lightly doping region.

Wherein, the halftone mask is a half-tone photomask or a gray-tone mask; wherein, the semi-transparent portion of the half-tone photomask corresponding to the first photoresist portion is a semi-transparent film; a transmittance rate of the semi-transparent film ranges from 0% to 100%; the semi-transparent portion of the gray-tone mask corresponding to the first photoresist portion has at least one slit in order to block a portion of lights to realize a semi-transparent effect; the at least one slit controls a transmittance rate to be ranged from 0% to 100%.

In order to solve above technology problems, the present invention also provides a doping method for an array substrate, comprising: using a halftone mask to form a photoresist pattern layer on a gate insulation layer of a substrate; wherein, a polysilicon pattern layer is disposed on the substrate; the gate insulation layer covers the polysilicon pattern layer; the photoresist pattern layer corresponding to a heavily doping region of the polysilicon pattern layer forms a hollow portion; the photoresist pattern layer corresponding to a lightly doping region of the polysilicon pattern layer forms a first photoresist portion; the photoresist pattern layer corresponding to an undoped region of the polysilicon pattern layer forms a second photoresist portion; the first photoresist portion is thinner than the second photoresist portion; and performing one doping process to the polysilicon pattern layer such that the heavily doping region and the lightly doping region of the polysilicon pattern layer are formed simultaneously.

Wherein, in the step of using a halftone mask to form a photoresist pattern layer on a gate insulation layer of a substrate comprises: forming the polysilicon pattern layer on the substrate; forming the gate insulation layer on the substrate having the polysilicon pattern layer; forming a gate pattern layer on the gate insulation layer; and using the halftone mask to form the photoresist pattern layer on the gate insulation layer having the gate pattern layer.

Wherein, the halftone mask includes a full transparent portion corresponding to the hollow portion, a semi-transparent portion corresponding to the first photoresist portion, and a non-transparent portion corresponding to the second photoresist portion; exposing the photoresist pattern layer using the halftone mask in order to form three exposure degrees of an exposed portion, a semi-exposed portion, and an unexposed portion; respectively etching the three exposure degrees in order to form the hollow portion corresponding to the exposed portion, the first photoresist portion corresponding to the semi-exposed portion, and the second photoresist portion corresponding to the unexposed portion.

In order to solve above technology problems, the present invention also provides A manufacturing equipment of an array substrate, comprising: a doping device; a halftone mask, and an exposure device for using the halftone mask to form a photoresist pattern layer on a gate insulation layer of a substrate, wherein, a polysilicon pattern layer is disposed on the substrate; the gate insulation layer covers the polysilicon pattern layer; the photoresist pattern layer corresponding to a heavily doping region of the polysilicon pattern layer forms a hollow portion; the photoresist pattern layer corresponding to a lightly doping region of the polysilicon pattern layer forms a first photoresist portion; the photoresist pattern layer corresponding to an undoped region of the polysilicon pattern layer forms a second photoresist portion; the first photoresist portion is thinner than the second photoresist portion; wherein, the doping device is used for performing one doping process to the polysilicon pattern layer such that the heavily doping region and the lightly doping region of the polysilicon pattern layer are formed simultaneously.

Wherein, the polysilicon pattern layer is formed on the substrate; the gate insulation layer is formed on the substrate having the polysilicon pattern layer; the gate pattern layer is formed on the gate insulation layer; the photoresist pattern layer is formed on the gate insulation layer having the gate pattern layer, and is formed by utilizing the exposure device through the halftone mask for exposing.

Wherein, the halftone mask includes a full transparent portion corresponding to the hollow portion, a semi-transparent portion corresponding to the first photoresist portion, and a non-transparent portion corresponding to the second photoresist portion; exposing the photoresist pattern layer using the halftone mask in order to form three exposure degrees of an exposed portion, a semi-exposed portion, and an unexposed portion; respectively etching the three exposure degrees in order to form the hollow portion corresponding to the exposed portion, the first photoresist portion corresponding to the semi-exposed portion, and the second photoresist portion corresponding to the unexposed portion.

Wherein, the polysilicon pattern layer is formed by utilizing a diffusion method or an ion implantation method to dope low temperature poly-silicon (LTPS) such that the polysilicon pattern layer includes the heavily doping region and the lightly doping region.

Wherein, the halftone mask is a half-tone photomask or a gray-tone mask; wherein, the semi-transparent portion of the half-tone photomask corresponding to the first photoresist portion is a semi-transparent film; a transmittance rate of the semi-transparent film ranges from 0% to 100%; the semi-transparent portion of the gray-tone mask corresponding to the first photoresist portion has at least one slit in order to block a portion of lights to realize a semi-transparent effect; the at least one slit controls a transmittance rate to be ranged from 0% to 100%.

Comparing to the conventional art, in the present invention, the halftone mask of the present invention includes a full transparent portion, a semi-transparent portion, and a non-transparent portion. The substrate provides with a polysilicon pattern layer. The gate insulation layer covers the polysilicon pattern layer. Through the halftone mask to form a photoresist pattern layer on the gate insulation layer such that the photoresist pattern layer forms a hollow portion corresponding to a heavily doping portion of the polysilicon pattern layer, a first photoresist portion corresponding to a lightly doping portion of the polysilicon pattern layer, and a second photoresist portion corresponding to an undoped portion of the polysilicon pattern layer. Besides, the first photoresist portion is thinner than the second photoresist portion. The step-shaped photoresist pattern layer is formed on the polysilicon pattern layer. Accordingly, performing one doping to the polysilicon pattern layer can form the heavily doping region, the lightly doping region, and the undoped channel region. One doping process to the polysilicon pattern layer in order to form the heavily doping region and the lightly doping region is realized. The manufacturing process for the LTPS array substrate is reduced in order to reduce the cost.

DETAILED DESCRIPTION OF THE PREFERRED EMBODIMENT

The following will combine drawings and embodiments for detailed description of the present invention.

Figure 1:
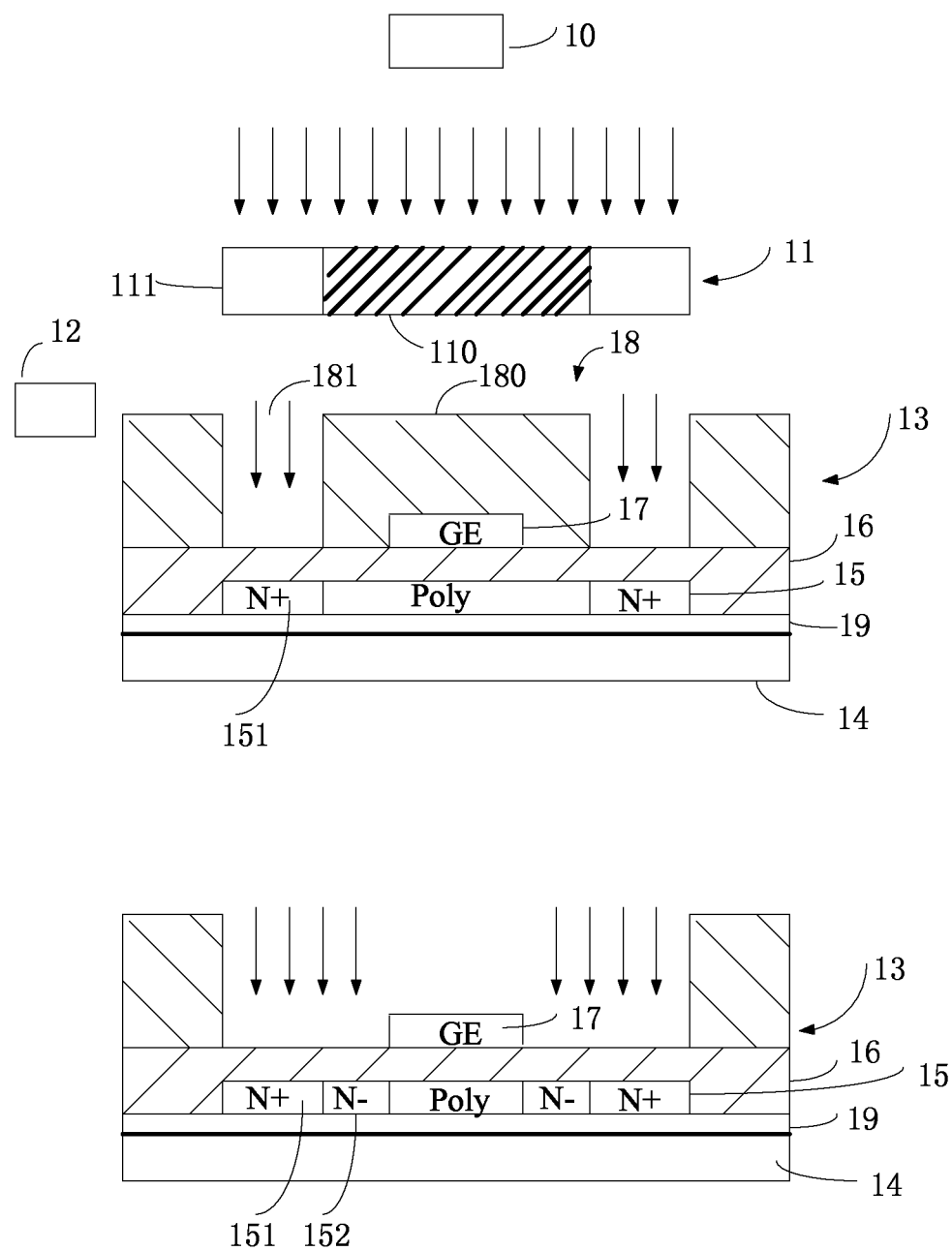
FIG. 1 is a schematic diagram of twice doping to an array substrate in the conventional art.

With reference to FIG. 1, FIG. 1 is a schematic diagram of twice doping to an array substrate in the conventional art. It should be noted that the disposition status of the manufacturing equipment, structure and status of each element of the array substrate shown in FIG. 1 are not appeared in a same process and at a same time when manufacturing actually. FIG. 1 only helps to illustrate the disposition status of the manufacturing equipment, structure and status of each element of the array substrate which are appeared in different process (exposure and doping). As shown in FIG. 1, the manufacturing equipment of the array substrate includes an exposure device 10, a mask 11, and a doping device 12. Here, utilizing the manufacturing equipment for twice doping to the array substrate 13 is used as an example. The array substrate 13 includes a substrate 14, a polysilicon pattern layer 15, a gate insulation layer 16, and a gate pattern layer 17.

Figure 2:
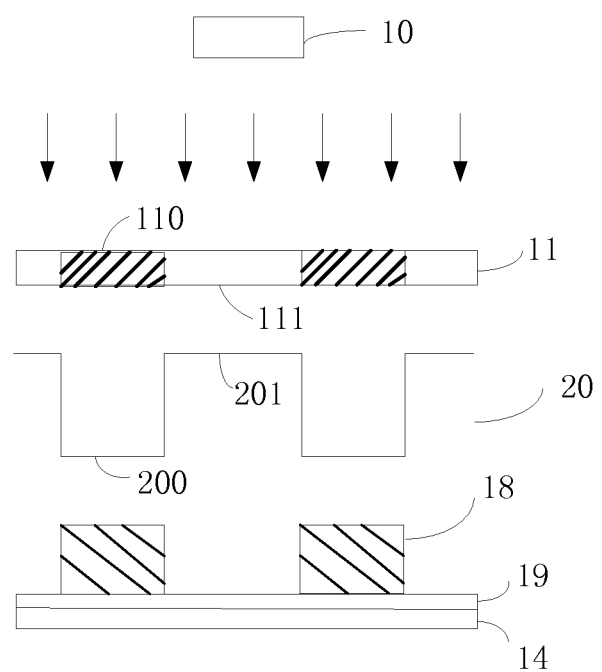
FIG. 2 is a schematic diagram of light penetrating principle of a mask in the conventional art.

The mask 11 includes a non-transparent portion 110 and a full transparent portion 111. The light penetrating principle of the mask 11 is shown in FIG. 2. A concave portion 200 of a light intensity curve 20 represents that lights cannot penetrate through the mask 11, and a convex portion 201 represents that lights can penetrate through the mask 11.

With both reference to FIG. 1 and FIG. 2, the doping process of the array substrate of the conventional art is further described. Firstly, forming a polysilicon pattern layer 15 on a substrate 14 of the array substrate 13. Wherein, a buffering layer 19 is further disposed between the polysilicon pattern layer 15 and the substrate 14. Preferably, the polysilicon pattern layer 15 is disposed on the buffering layer 19. A gate insulation layer 16 is formed on the substrate 14 having the polysilicon pattern layer 15. A gate pattern layer 17 is formed on the gate insulation layer 16. Finally, a photoresist pattern layer 18 is formed on the gate insulation layer 16 having the gate pattern layer 17 using the exposure device 10. Wherein, the exposure device 10 exposes the photoresist pattern layer 18 through the mask 11 such that the full transparent portion 111 of the mask 11 can form an exposed portion in the photoresist pattern layer 18, and the non-transparent portion 110 of the mask 11 can form an unexposed portion in the photoresist pattern layer 18. Therefore, the photoresist pattern layer 18 forms the exposed portion and the unexposed portion. The exposed portion is removed after developing the photoresist pattern layer 18. The exposed portion of the photoresist pattern layer 18 forms a hollow portion 181, and the unexposed portion of the photoresist pattern layer 18 forms a photoresist layer having a certain of thickness after developing.

Etching the photoresist layer formed by the unexposed portion of the photoresist pattern layer 18, the unexposed portion of the photoresist pattern layer 18 forms a photoresist portion 180. Besides, the hollow portion 181 of the photoresist pattern layer 18 corresponds to a heavily doping region 151 of the polysilicon pattern layer 15. Through the doping device 12, a first heavily doping is performed to the polysilicon pattern layer 15 such that the heavily doping region 151 of the polysilicon pattern layer 15 is formed. Removing the photoresist corresponding to a region which is waited for doping, performing a second lightly doping to the polysilicon pattern layer 15 such that a lightly doping region 152 of the polysilicon pattern layer 15 is formed. Through twice doping process, the polysilicon pattern layer 15 forms the heavily doping region 151 and the lightly doping region 152.

Figure 3:
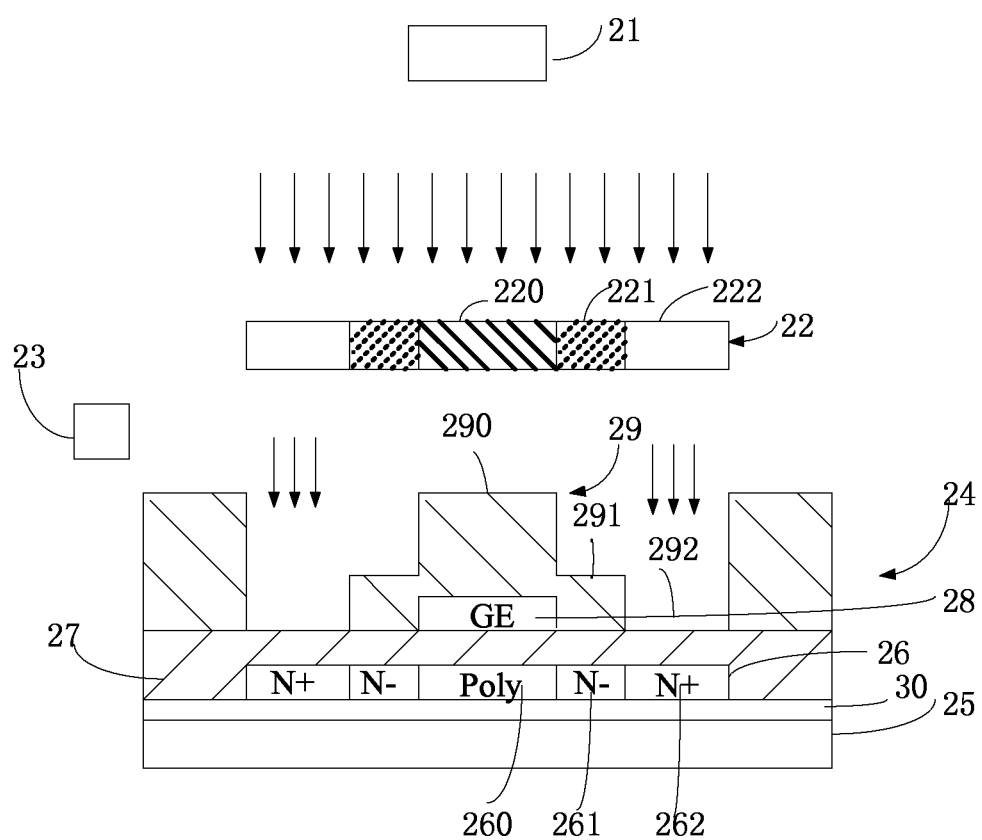
FIG. 3 is a schematic diagram of a doping method of an array substrate when exposing and doping according to a first embodiment of the present invention; in the figure, a schematic diagram of a manufacturing equipment of the array substrate according to the first embodiment is also shown.

However, the conventional art require twice doping to the polysilicon pattern layer 15 in order to form the heavily doping region 151 and the lightly doping region 152. The process is more complex and the cost is higher. The present invention provides a manufacturing equipment for forming the array substrate which requires only one doping process. With reference to FIG. 3, FIG. 3 is a schematic diagram of doping method of an array substrate when exposure and doping according to a first embodiment of the present invention; in the figure, a schematic diagram of a manufacturing equipment of the array substrate according to the first embodiment is also shown. Usually, an array substrate includes an N-type transistor and a P-type transistor. Wherein, the N-type transistor is disposed with a channel region, a lightly doping region, and a heavily doping region; the P-type transistor is only disposed with a channel region and a heavily doping region. The present embodiment uses an array substrate having an N-type transistor for illustration.

Figure 5:
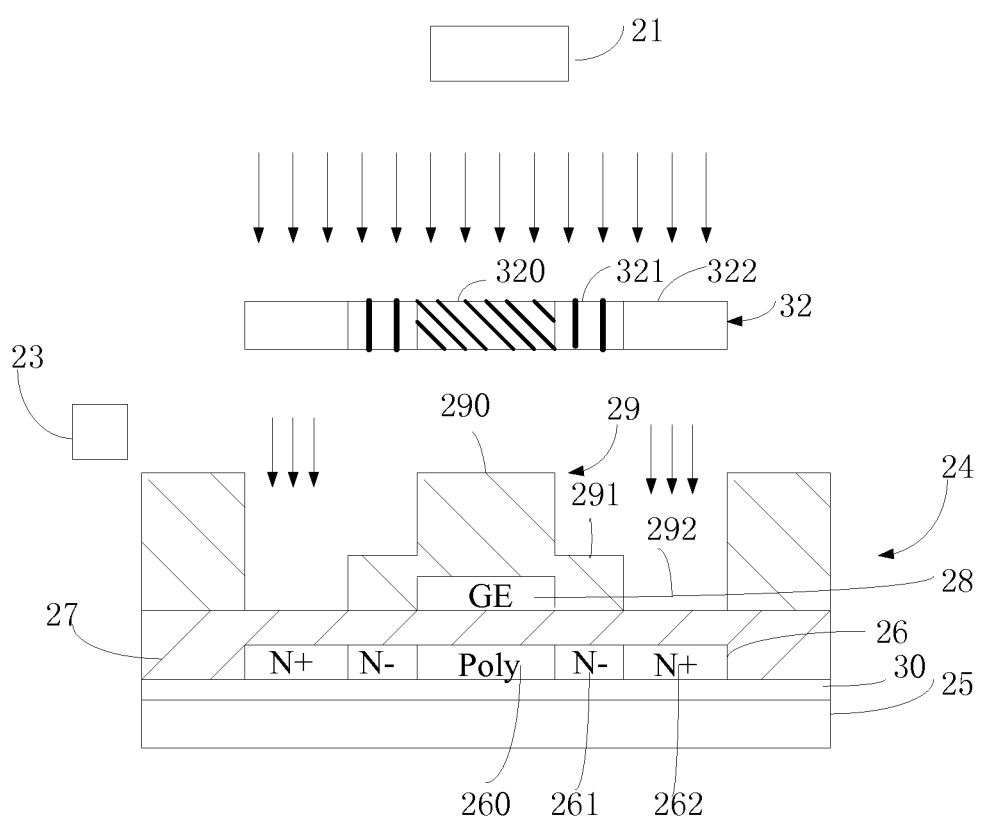
FIG. 5 is a schematic diagram of a doping method of an array substrate when exposing and doping according to a second embodiment of the present invention; in the figure, a schematic diagram of a manufacturing equipment of the array substrate according to the second embodiment is also shown.

It should be noted that the disposition status of the manufacturing equipment, structure and status of each element of the array substrate shown in FIG. 3 are not appeared in a same process and at a same time when manufacturing actually. FIG. 3 only helps to illustrate the disposition status of the manufacturing equipment, structure and status of each element of the array substrate which are appeared in different process (exposing and doping). Similarly, FIG. 5 is the same. As shown in FIG. 3, the manufacturing equipment of an array substrate 24 includes an exposure device 21, a halftone mask 22, and a doping device 23; the array substrate 24 includes a substrate 25, a polysilicon pattern layer 26, a gate insulation layer 27, a gate pattern layer 28, and a buffering layer 30.

Wherein, the exposure device 21 utilize the halftone mask 22 for forming a photoresist pattern layer 29 on the gate insulation layer 27 of the substrate 25. The substrate 25 provides with the polysilicon pattern layer 26. The gate insulation layer 27 covers the polysilicon pattern layer 26 such that a portion of the photoresist pattern layer 29 corresponding to a heavily doping region 262 forms a hollow portion 292 and a portion of the photoresist pattern layer 29 corresponding to a lightly doping region 261 of the polysilicon pattern layer 26 forms a first photoresist portion 291, a portion of the photoresist pattern layer 29 corresponding to undoped region 260 forms a second photoresist portion 290. The first photoresist portion 291 is thinner than the second photoresist portion 290. The doping device performs one doping to the polysilicon pattern layer 26 in order to form the heavily doping region 262 and the lightly doping region 261 of the polysilicon pattern layer 26 simultaneously.

In the present embodiment, the substrate 25 is a glass substrate. The polysilicon pattern layer 26 is formed on the substrate 25. The polysilicon pattern layer 26 is also called an active layer. Besides, a buffering layer 30 is further disposed between the substrate 25 and the polysilicon pattern layer 26. The polysilicon pattern layer 26 is formed on the buffering layer 30. The gate insulation layer 27 is formed on the polysilicon pattern layer 26. The gate pattern layer 28 is formed on the gate insulation layer 27. Wherein, the gate insulation layer 27 is made of an inorganic and insulation material such as $SiO_2$ or SiNx such that the gate insulation layer 27 forms on the entire surface of the substrate 25. The photoresist pattern layer 29 is formed on the gate insulation layer 27 by the exposure device 21 and the halftone mask 22.

Figure 4:
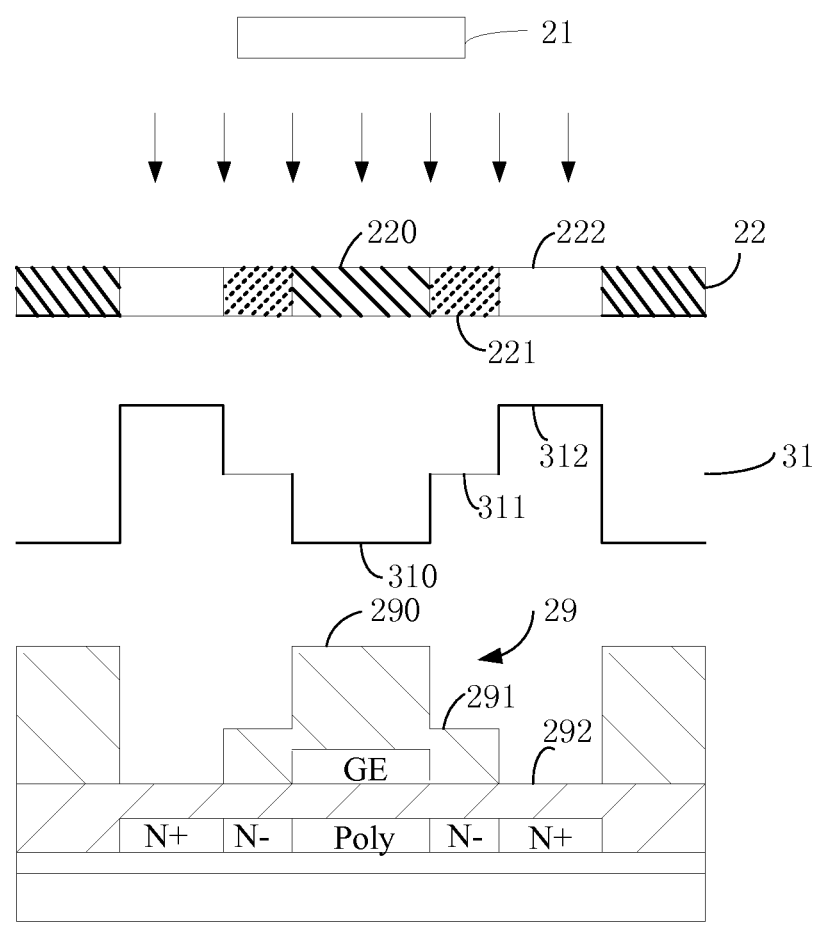
FIG. 4 is a schematic diagram of light penetrating principle of a halftone mask shown in FIG. 3.

In the present embodiment, the halftone mask 22 comprises a full transparent portion 222 corresponding to a hollow portion 292 of the photoresist pattern layer 29, a semi-transparent portion 221 corresponding to a the first photoresist portion 291 of the photoresist pattern layer 29, and a non-transparent portion 220 corresponding to a the second photoresist portion 290 of the photoresist pattern layer 29. The light penetrate principle of the halftone mask 22 is shown in FIG. 4. In a light intensity curve 31, a first concave portion 310 represents that lights cannot penetrate through the halftone mask 22, a second concave portion 311 represents that half of lights can penetrate through the halftone mask 22, numeral 312 represents that lights can penetrate through the halftone mask 22.

The manufacturing process of the present embodiment is as following. First, exposing the photoresist pattern layer 29 using the exposure device 21 and through the halftone mask 22. Because the halftone mask 22 has the full transparent portion 222, the semi-transparent portion 221, and non-transparent portion 220 which have three different transparent degrees. As a result, after one exposure process, the photoresist pattern layer 29 forms an exposed portion, a semi-exposed portion, and an unexposed portion which are three different exposure degrees. The principle is: exposing the photoresist pattern layer 29 through the full transparent portion 222 of the halftone mask 22 by the exposure device 21 in order to form the exposed portion. At the same time, exposing the photoresist pattern layer 29 through the semi-transparent portion 221 of the halftone mask 22 by the exposure device 21 in order to form the semi-exposed portion. The exposure device 21 does not expose the photoresist pattern layer 29 through the non-transparent portion 220 of the halftone mask 22 in order to form the unexposed portion.

Secondly, developing the photoresist pattern layer 29. During development, the exposed portion is removed to form a hollow portion 292 such that a photoresist having two thicknesses is formed in the photoresist pattern layer 29. Etching the photoresist such that the semi-exposed portion forms a first photoresist portion 291, the unexposed portion forms a second photoresist portion 290. Besides, the first photoresist portion 291 is thinner than the second photoresist portion 290. In the present embodiment, the hollow portion 292 of the photoresist pattern layer 29 corresponds to a heavily doping region 262 of the polysilicon pattern layer 26, the first photoresist portion 291 of the photoresist pattern layer 29 corresponds to a lightly doping region 261 of the polysilicon pattern layer 26, and the second photoresist portion 290 of the photoresist pattern layer 29 corresponds to an undoped region 260 of the polysilicon pattern layer 26.

Because the finished polysilicon pattern layer 26 includes a heavily doping region and a lightly doping region by one doping process, that is, the heavily doping region 262 and the lightly doping region 261. Accordingly, the final doping process is: doping the polysilicon pattern layer 26 through the doping device 23. The doping utilizes a diffusion method or an ion implantation method to dope low-temperature polysilicon (LTPS). After doping, the polysilicon pattern layer 26 includes a heavily doping region and lightly doping region. In the present embodiment, adopting a low pressure chemical vapor deposition to form a polysilicon thin film, that is, to form an active layer (not shown). Adopting the ion implantation method to dope phosphorus atoms or antimony atoms in order to form the polysilicon pattern layer 26. Because the step-shaped photoresist pattern layer 29 is formed on the gate insulation layer 27 which covers the polysilicon pattern layer 26, to dope the phosphorus atoms or the antimony atoms into the polysilicon pattern layer 26, only one doping process is required in order to form the heavily doping region and a lightly doping region. The principle is: the doping device 23 performs doping to form the heavily doping region 262 through the hollow portion 292 of the photoresist pattern layer 29 by one doping. At the same time, the lightly doping region 261 is formed through the first photoresist portion 291. The heavily doping region and the lightly doping region are both formed by one doping process.

In addition, an undoped region 260 of the polysilicon pattern layer 26 forms a channel region. Wherein, the lightly doping region and the channel region form a conductive area of the polysilicon pattern layer 26. In another embodiment, a light blocking layer (not shown) may cover on the conductive area in order to decrease the leakage current and improve display quality. As a result, the doping process for the array substrate is finished and only one doping process is required in order to form a heavily doping region and a lightly doping region in the polysilicon pattern layer 26.

In the present embodiment, the exposure device 21 adopts the halftone mask 22 to expose, semi-expose, and not to expose the photoresist pattern layer 29 in order to form the hollow portion 292, the first photoresist portion 291, and the second photoresist portion 290, which are decided by the structure of the halftone mask 22.

In the present embodiment, the halftone mask 22 is a half-tone photomask (referred as HTM). Wherein, the semi-transparent portion 221 of the halftone mask 22 is a semi-transparent film. The transmittance rate of the semi-transparent film ranges from 0% to 100%.

Comparing to the conventional art, in the present invention, the exposure device 21 adopts the halftone mask 22 to form the photoresist pattern layer 29 on the gate insulation layer 27. Because the polysilicon pattern layer 26 is disposed on the substrate 25, the gate insulation layer 27 covers the polysilicon pattern layer 26, the halftone mask 22 includes the full transparent portion 222, the semi-transparent portion 221, and the non-transparent portion 220, wherein, the semi-transparent portion 221 is a semi-transparent film, through controlling the transmittance rate of the semi-transparent film to realize the semi-exposure effect. As a result, the first photoresist portion 291 corresponding to the lightly doping region 261 of the polysilicon pattern layer 26 is formed in the photoresist pattern layer 29, the hollow portion 292 corresponding to the heavily doping region 261 of the polysilicon pattern layer 26 is formed in the photoresist pattern layer 29, and the second photoresist portion 292 corresponding to the undoped region 260 of the polysilicon pattern layer 26 is formed in the photoresist pattern layer 29. The photoresist pattern layer 29 forms a step shape by the hollow portion 292, the first photoresist portion 291, and the second photoresist portion 290. Using the step-shaped photoresist pattern layer 29, forming the heavily doping region and the lightly doping region in the polysilicon 26 by one doping process is realized by the doping device 23.

Figure 6:
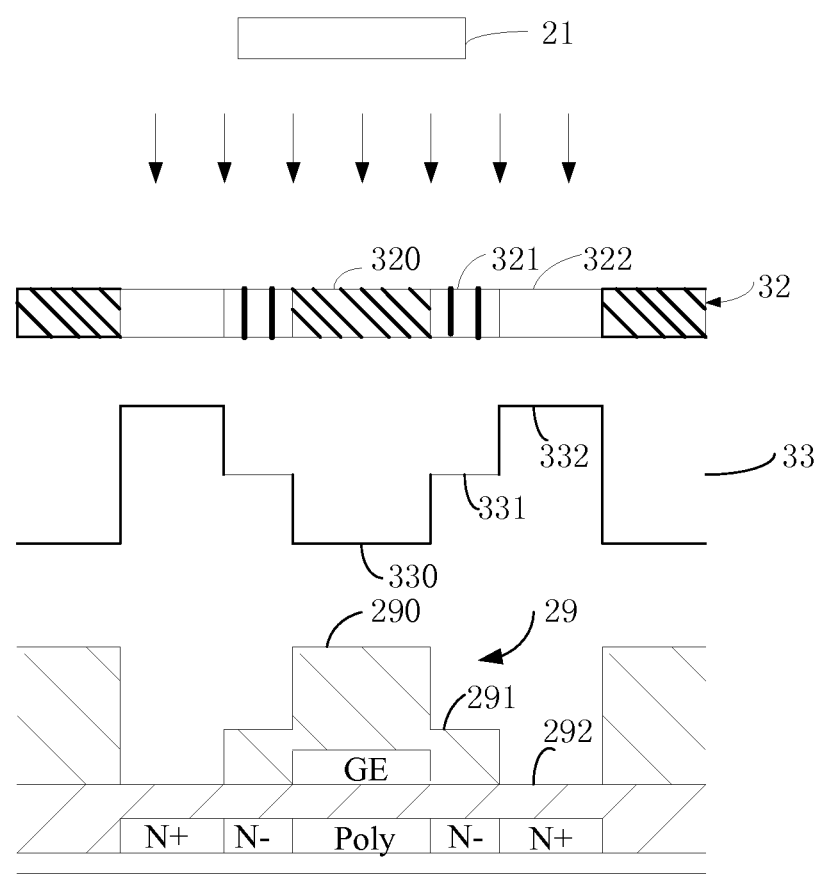
FIG. 6 is a schematic diagram of light penetrating principle of a halftone mask shown in FIG. 5.

With both reference to FIG. 5 and FIG. 6, wherein, FIG. 5 is a schematic diagram of doping method of an array substrate when exposure and doping according to a second embodiment of the present invention; in the figure, a schematic diagram of a manufacturing equipment of the array substrate according to the second embodiment is also shown; FIG. 6 is a schematic diagram of light penetrating principle of a halftone mask shown in FIG. 5. Wherein, FIG. 5 is similar to FIG. 3, therefore, FIG. 5 only help to illustrate the disposition status of the manufacturing equipment, structure and status of each element of the array substrate which are appeared in different process (exposing and doping), and the disposition status of the manufacturing equipment, structure and status of each element of the array substrate shown in FIG. 5 are not appeared in a same process and at a same time when manufacturing actually. As shown in FIG. 5, the manufacturing equipment includes an exposure device 21, a halftone mask 32, and a doping device 23. Wherein, the exposure device 21 and the doping device 23 are the same as the elements shown in FIG. 3.

In FIG. 5, the array substrate 24 includes a substrate 25, a polysilicon pattern layer 26, a gate insulation layer 27, a gate pattern layer 28 and a buffering layer 30. The structure and function of the above elements are the same as shown in FIG. 3. The difference between the embodiment in FIG. 5 and the embodiment in FIG. 3 is: the halftone mask 32 in FIG. 5 is a gray-tone mask (referred as GTM). The semi-transparent portion 321 of the halftone mask 32 has at least one slit in order to block some lights to realize a semi-transparent effect. The slit control the transmittance rate to be ranged from 0% to 100%. In another embodiment, the halftone mask 32 can also be a single slit mask (referred as SSM).

Figure 7:
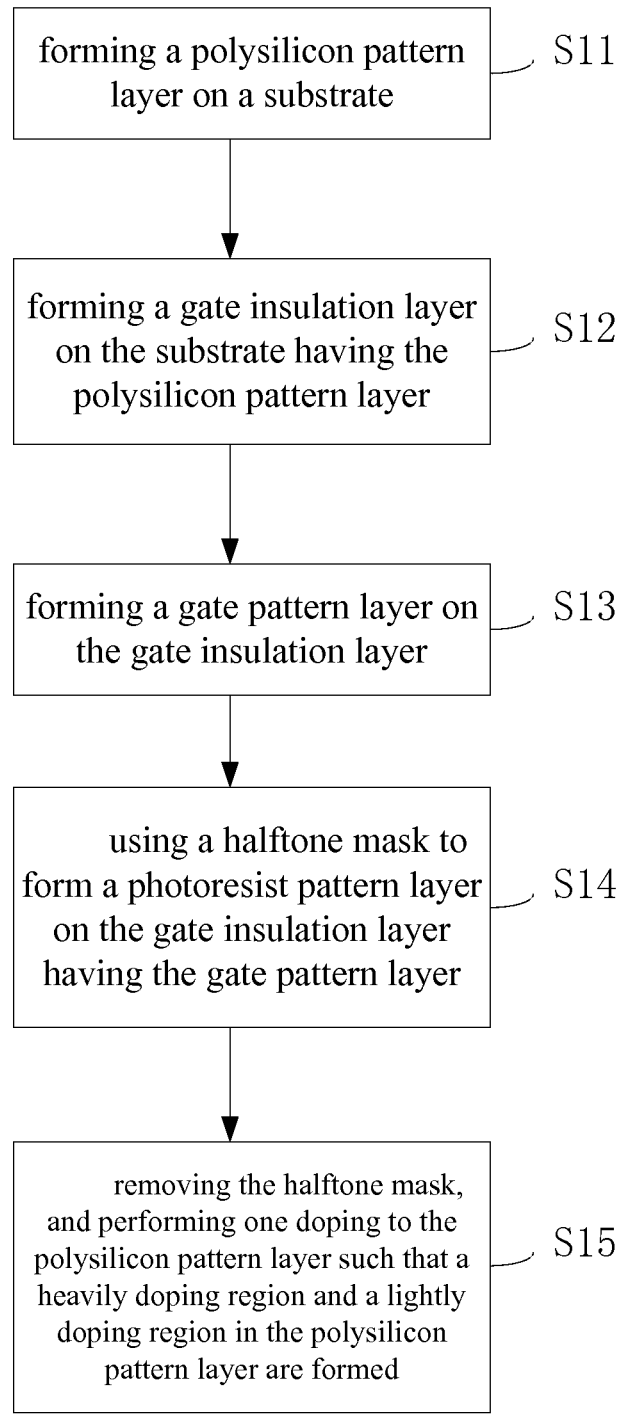
FIG. 7 is a schematic flow chart of the doping method of the array substrate according to the first embodiment of the present invention.

Please both refer to FIG. 3 and FIG. 7 together, wherein, FIG. 7 is a schematic flow chart of a doping method of an array substrate according to a first embodiment of the present invention. As shown in FIG. 7, the doping process of the array substrate includes following steps:

S11: forming a polysilicon pattern layer 26 on a substrate 25.

Wherein, the polysilicon pattern layer 26 is formed on the substrate 25 by a low pressure chemical vapor deposition method or a direct method. In another embodiment, polysilicon pattern layer 26 can also be formed by an excimer laser crystallization method. Preferably, a buffering layer 30 is disposed between the substrate 25 and the polysilicon pattern layer 26. The polysilicon pattern layer 26 is disposed on the buffering layer 30.

Wherein, the substrate 25 is a glass substrate. The polysilicon pattern layer 26 is also called an active layer. The polysilicon pattern layer 26 includes a heavily doping region 262, a lightly doping region 261, and an undoped region 260. The lightly doping region 261 and the undoped region 260 form a channel region to form a conductive area of the polysilicon pattern layer 26. In another embodiment, a light blocking layer (not shown) is further covered on the conductive area in order to decrease the leakage current and improve display quality.

S12: forming a gate insulation layer 27 on the substrate 25 having the polysilicon pattern layer 26.

S13: forming a gate pattern layer 28 on the gate insulation layer 27.

Wherein, the gate insulation layer 27 is made of an inorganic insulation material, such as silicon oxide ($SiO_2$) or silicon nitride ($SiN_x$) deposited on the polysilicon pattern layer 26 in order to form the gate insulation layer 27 on the entire surface of the substrate 25.

S14: using a halftone mask 22 to form a photoresist pattern layer 29 on the gate insulation layer 27 having the gate pattern layer 28.

In the step of using a halftone mask 22 to form a photoresist pattern layer 29 on the gate insulation layer 27 having the gate pattern layer 28, since the substrate 25 provides with the polysilicon pattern layer 26 and the gate insulation layer 27 covers the polysilicon pattern layer 26, a portion of the photoresist pattern layer 29 corresponding to a heavily doping region 262 of the polysilicon pattern layer 26 forms a hollow portion 292, another portion of the photoresist pattern layer 29 corresponding to a lightly doping region 261 of the polysilicon pattern layer 26 forms a first photoresist portion 291, and another portion of the photoresist pattern layer 29 corresponding to an undoped region 260 of the polysilicon pattern layer 26 forms a second photoresist portion 290. Wherein, the first photoresist portion 291 is thinner than the second photoresist portion 290. Doping the polysilicon pattern layer 26 once in order to simultaneously form the heavily doping region 262 and the lightly doping region 261.

Wherein, the halftone mask 22 includes a full transparent portion 222, a semi-transparent portion 221, and a non-transparent portion 220. In the present embodiment, an exposure device 21 utilizes the halftone mask 22 to expose the photoresist pattern layer 29. The halftone mask 22 includes a full transparent portion 222, a semi-transparent portion 221, and a non-transparent portion 220 which are different in the transparent degrees. Therefore, an exposed portion, a semi-exposed portion, and an unexposed portion will be formed after one exposure process on the photoresist pattern layer 29. The principle is: exposing the photoresist pattern layer 29 through the full transparent portion 222 of the halftone mask 22 by the exposure device 21 in order to form the exposed portion. At the same time, exposing the photoresist pattern layer 29 through the semi-transparent portion 221 of the halftone mask 22 by the exposure device 21 in order to form the semi-exposed portion. The exposure device 21 does not expose the photoresist pattern layer 29 through the non-transparent portion 220 of the halftone mask 22 in order to form the unexposed portion.

After exposure process, developing the photoresist pattern layer 29. During development, the exposed portion is removed to form a hollow portion 292 such that a photoresist having two thicknesses is formed in the photoresist pattern layer 29. Etching the photoresist such that the semi-exposed portion forms a first photoresist portion 291, the unexposed portion forms a second photoresist portion 290. Besides, the first photoresist portion 291 is thinner than the second photoresist portion 290.

As a result, the photoresist pattern layer 29 forms the hollow portion 292, the first photoresist portion 291, and the second photoresist portion 290 such that the three portions form a step-shaped structure.

In the present embodiment, the exposure device 21 utilizes the halftone mask 22 to expose the photoresist pattern layer 29. The photoresist pattern layer 29 form the exposed portion, the semi-exposed portion, and the unexposed portion according to the light penetrating property of the halftone mask 22 in order to respectively form the corresponding hollow portion 292, the first photoresist portion 291, and the second photoresist portion 290. In the present embodiment, the halftone mask 22 is a half-tone photomask (referred to as HTM), and the semi-transparent portion 221 is a semi-transparent film. A transmittance rate of the semi-transparent film ranges from 0% to 100%.

Furthermore, the structure of the halftone mask 22 can also be the structure shown in FIG. 5. The halftone mask 32 is a gray-tone mask (referred as GTM). The semi-transparent portion 321 have at least one slit in order to block a portion of lights to realize a semi-transparent effect. The transmittance rate is controlled by the slit to be ranged from 0% to 100%. In another embodiment, the halftone mask 32 can also be a single slit mask (SSM).

S15: removing the halftone mask 22, and performing one doping to the polysilicon pattern layer 26 such that a heavily doping region and a lightly doping region in the polysilicon pattern layer 26 are formed.

Usually, an array substrate includes an N-type transistor and a P-type transistor. Wherein, the N-type transistor is disposed with a channel region, a lightly doping region, and a heavily doping region; the P-type transistor is only disposed with a channel region and a heavily doping region. The present embodiment uses an array substrate having an N-type transistor for illustration.

In the present embodiment, the doping device 23 performs an N-type doping to the polysilicon pattern layer 26. Wherein, the N-type doping utilizes a diffusion method or an ion implantation method to dope phosphorus atoms or antimony atoms into the polysilicon pattern layer 26.

Because the polysilicon pattern layer 26 is provided with the step-shaped photoresist pattern layer 29. Only one doping process to the polysilicon pattern layer 26 is required in order to form a heavily doping region and a lightly doping region in the polysilicon pattern layer 26. In addition, an undoped region 260 of the polysilicon pattern layer 26 forms a channel region. Wherein, the lightly doping region and the channel region form a conductive area of the polysilicon pattern layer 26. The lightly doping region and the heavily doping region are both formed by one doping process. In another embodiment, a light blocking layer (not shown) may cover on the conductive area in order to decrease the leakage current and improve display quality.

In summary, the halftone mask of the present invention includes a full transparent portion, a semi-transparent portion, and a non-transparent portion. The substrate provides with a polysilicon pattern layer. The gate insulation layer covers the polysilicon pattern layer. Through the halftone mask to form a photoresist pattern layer on the gate insulation layer such that the photoresist pattern layer forms a hollow portion corresponding to a heavily doping portion of the polysilicon pattern layer, a first photoresist portion corresponding to a lightly doping portion of the polysilicon pattern layer, and a second photoresist portion corresponding to an undoped portion of the polysilicon pattern layer. Besides, the first photoresist portion is thinner than the second photoresist portion. The step-shaped photoresist pattern layer is formed on the polysilicon pattern layer. Accordingly, performing one doping to the polysilicon pattern layer can form the heavily doping region, the lightly doping region, and the undoped channel region. One doping process to the polysilicon pattern layer in order to form the heavily doping region and the lightly doping region is realized. The manufacturing process for the LTPS array substrate is reduced in order to reduce the cost.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A doping method for an array substrate, comprising:
    forming a polysilicon pattern layer on a substrate;
    forming a gate insulation layer on the substrate having the polysilicon pattern layer;
    forming a gate pattern layer on the gate insulation layer;
    using a halftone mask to form a photoresist pattern layer on the gate insulation layer;
        wherein, the gate insulation layer covers on the polysilicon pattern layer; the photoresist pattern layer corresponding to a heavily doping region of the polysilicon pattern layer forms a hollow portion; the photoresist pattern layer corresponding to a lightly doping region of the polysilicon pattern layer forms a first photoresist portion; the photoresist pattern layer corresponding to an undoped region of the polysilicon pattern layer forms a second photoresist portion; the first photoresist portion is thinner than the second photoresist portion; and
        wherein, the halftone mask includes a full transparent portion corresponding to the hollow portion, a semi-transparent portion corresponding to the first photoresist portion, and a non-transparent portion corresponding to the second photoresist portion; exposing the photoresist pattern layer using the halftone mask in order to form three exposure degrees of an exposed portion, a semi-exposed portion, and an unexposed portion; respectively etching the three exposure degrees in order to form the hollow portion corresponding to the exposed portion, the first photoresist portion corresponding to the semi-exposed portion, and the second photoresist portion corresponding to the unexposed portion; and
    performing one doping process to the polysilicon pattern layer such that the heavily doping region and the lightly doping region of the polysilicon pattern layer are formed simultaneously.

2. The doping method according to claim 1, wherein, in the step of performing one doping process to the polysilicon pattern layer comprises:
    utilizing a diffusion method or an ion implantation method to dope low temperature poly-silicon (LTPS) in order to form the polysilicon pattern layer such that the polysilicon pattern layer includes the heavily doping region and the lightly doping region.

3. The doping method according to claim 1, wherein, the halftone mask is a half-tone photomask or a gray-tone mask; wherein, the semi-transparent portion of the half-tone photomask corresponding to the first photoresist portion is a semi-transparent film; a transmittance rate of the semi-transparent film ranges from 0% to 100%; the semi-transparent portion of the gray-tone mask corresponding to the first photoresist portion has at least one slit in order to block a portion of lights to realize a semi-transparent effect; the at least one slit controls a transmittance rate to be ranged from 0% to 100%.

4. A doping method for an array substrate, comprising:
    using a halftone mask to form a photoresist pattern layer on a gate insulation layer of a substrate; wherein, a polysilicon pattern layer is disposed on the substrate; the gate insulation layer covers the polysilicon pattern layer; the photoresist pattern layer corresponding to a heavily doping region of the polysilicon pattern layer forms a hollow portion; the photoresist pattern layer corresponding to a lightly doping region of the polysilicon pattern layer forms a first photoresist portion; the photoresist pattern layer corresponding to an undoped region of the polysilicon pattern layer forms a second photoresist portion; the first photoresist portion is thinner than the second photoresist portion; and
    performing one doping process to the polysilicon pattern layer such that the heavily doping region and the lightly doping region of the polysilicon pattern layer are formed simultaneously.

5. The doping method according to claim 4, wherein, in the step of using a halftone mask to form a photoresist pattern layer on a gate insulation layer of a substrate comprises:
    forming the polysilicon pattern layer on the substrate;
    forming the gate insulation layer on the substrate having the polysilicon pattern layer;
    forming a gate pattern layer on the gate insulation layer; and
    using the halftone mask to form the photoresist pattern layer on the gate insulation layer having the gate pattern layer.

6. The doping method according to claim 4, wherein, the halftone mask includes a full transparent portion corresponding to the hollow portion, a semi-transparent portion corresponding to the first photoresist portion, and a non-transparent portion corresponding to the second photoresist portion; exposing the photoresist pattern layer using the halftone mask in order to form three exposure degrees of an exposed portion, a semi-exposed portion, and an unexposed portion; respectively etching the three exposure degrees in order to form the hollow portion corresponding to the exposed portion, the first photoresist portion corresponding to the semi-exposed portion, and the second photoresist portion corresponding to the unexposed portion.

7. The doping method according to claim 4, wherein, in the step of performing one doping process to the polysilicon pattern layer comprises:
    utilizing a diffusion method or an ion implantation method to dope low temperature poly-silicon (LTPS) in order to form the polysilicon pattern layer such that the polysilicon pattern layer includes the heavily doping region and the lightly doping region.

8. The doping method according to claim 4, wherein, the halftone mask is a half-tone photomask or a gray-tone mask; wherein, the semi-transparent portion of the half-tone photomask corresponding to the first photoresist portion is a semi-transparent film; a transmittance rate of the semi-transparent film ranges from 0% to 100%; the semi-transparent portion of the gray-tone mask corresponding to the first photoresist portion has at least one slit in order to block a portion of lights to realize a semi-transparent effect; the at least one slit controls a transmittance rate to be ranged from 0% to 100%.

* * * * *